US008382060B2

(12) United States Patent
Haehn et al.

(10) Patent No.: US 8,382,060 B2
(45) Date of Patent: Feb. 26, 2013

(54) COMPONENT ORIENTATION ELEMENT

(75) Inventors: Craig S. Haehn, Lorain, OH (US); Christopher J. Polmear, Southfield, MI (US); Timothy J. Frashure, Columbia Station, OH (US); Daniel P. Zula, North Ridgeville, OH (US)

(73) Assignee: Bendix Commercial Vehicle Systems LLC, Elyria, OH (US)

( * ) Notice: Subject to any disclaimer, the term of this patent is extended or adjusted under 35 U.S.C. 154(b) by 304 days.

(21) Appl. No.: 12/881,826

(22) Filed: Sep. 14, 2010

(65) Prior Publication Data

US 2012/0061552 A1 Mar. 15, 2012

(51) Int. Cl.
*B60P 1/43* (2006.01)
*B60K 5/12* (2006.01)

(52) U.S. Cl. ........ 248/635; 248/636; 248/638; 280/727; 280/728.2; 307/9.1

(58) Field of Classification Search .................. 248/636, 248/638, 635; 280/727, 728.2; 307/9.1, 307/10.1

See application file for complete search history.

(56) References Cited

U.S. PATENT DOCUMENTS 4,354,652 A 10/1982 Zegarski et al.
4,729,418 A 3/1988 Rude
5,212,984 A 5/1993 Norling et al.
5,996,408 A 12/1999 TenBrink et al.
6,276,652 B1 8/2001 Rieger
6,349,918 B1 * 2/2002 Bunker ......................... 248/635
6,396,163 B1 5/2002 Sugiura et al.
6,398,252 B1 * 6/2002 Ishikawa et al. .............. 280/727
6,409,030 B1 6/2002 Schlemper
6,746,089 B2 * 6/2004 Nakazawa ................ 303/116.4
7,291,023 B1 * 11/2007 Still et al. ..................... 439/76.1
7,618,012 B2 11/2009 Itoh
2009/0184229 A1 * 7/2009 Peltier .......................... 248/634
2009/0300893 A1 12/2009 Herrmann et al.

FOREIGN PATENT DOCUMENTS

WO 2006048014 A1 5/2006

OTHER PUBLICATIONS

Bendix Service Data, EC-60 ABS/ATC/ESP Controllers (Advanced Models), SD-13/4869, BW2429, May 2005.

* cited by examiner

*Primary Examiner* — Anita M King
(74) *Attorney, Agent, or Firm* — Calfee, Halter & Griswold LLP

(57) ABSTRACT

A component to be mounted on a vehicle includes a housing, a pair of component mounting passages, defined in the housing, aligning with a pair of respective vehicle mounting passages when the component is any of a plurality of orientations with respect to the vehicle, and a component orientation element, on the housing. The component orientation element cooperates with a vehicle orientation element only when the component is in one of the plurality of orientations with respect to the vehicle. A hub on the component orientation element acts to tune the component orientation element for attenuating vibration received by the component orientation element from the vehicle.

18 Claims, 12 Drawing Sheets

10 42 32 24 20 22 28 14 26 40 12 30 16 29

FIG. 4
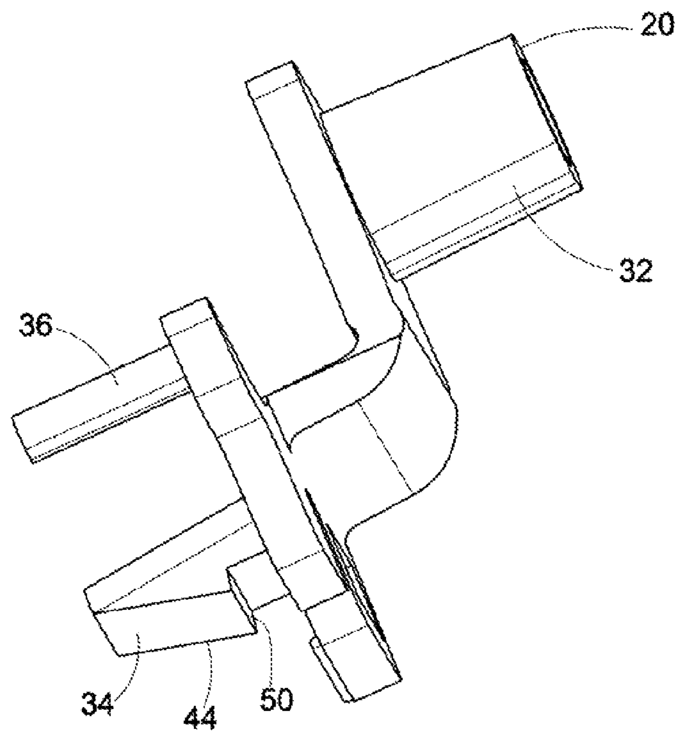
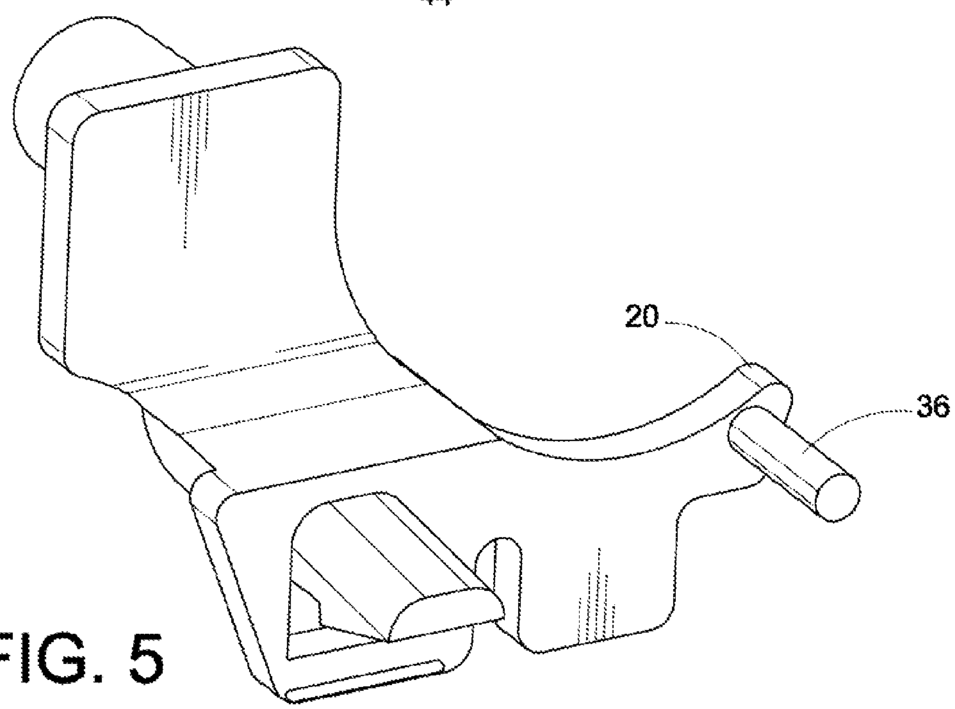
FIG. 5

32
20

32
34
20

46
44
50

COMPONENT ORIENTATION ELEMENT

BACKGROUND

The present invention relates to a yaw-rate sensor mounted to a vehicle. It finds particular application in conjunction with a component orientation element used to avoid improper installation of the sensor on the vehicle and to attenuate vibration transmitted from the vehicle to the sensor and will be described with particular reference thereto. It will be appreciated, however, that the invention is also amenable to other applications.

Installing components to a vehicle requires time and attention for ensuring the component is installed correctly. For example, a yaw-rate sensor must be installed in a correct orientation for the sensor to operate properly. Although two-bolt mounting configurations typically reduce the amount of time, thought, and materials required to install a component to a vehicle, it also may increase the possibility that the component is erroneously installed. More specifically, two-bolt mounting configurations permit four-degrees of freedom (i.e., four (4) mounting configurations), including three (3) incorrect configurations (e.g., upside-down, backwards, and a combination of both). In the case of a yaw-rate sensor, a vehicle's electronic control unit (ECU) associated with an electronic stability program (ESP) often times cannot readily confirm if the sensor is mounted in the correct orientation before a vehicle leaves a manufacturer's plant.

One way component manufacturers have addressed the issue described above has been to design a three-bolt mounting configuration. Three-bolt mounting configuration designs may be used to reduce the number of degrees of freedom for mounting a component to a vehicle if, for example, the third bolt is asymmetrically spaced from the other two (2) bolts. However, such designs require additional hardware. Furthermore, since standard mounting brackets on vehicles typically include evenly spaced holes that must be aligned with the bolts on the component, three-bolt designs may result in increased complexity due to the asymmetric spacing between the bolts. More specifically, care must be taken to ensure the asymmetrically spaced three-bolts will correctly align with the evenly spaced holes on standard mounting brackets.

It is also desirable to damp vibrations received by the component from the vehicle.

The present invention provides a new and improved apparatus and method which addresses the above-referenced problems.

SUMMARY

In one embodiment, a component to be mounted on a vehicle includes a housing, a pair of component mounting passages, defined in the housing, aligning with a pair of respective vehicle mounting passages when the component is any of a plurality of orientations with respect to the vehicle, and a component orientation element, on the housing. The component orientation element cooperates with a vehicle orientation element only when the component is in one of the plurality of orientations with respect to the vehicle. A hub on the component orientation element acts to tune the component orientation element for attenuating vibration received by the component orientation element from the vehicle.

BRIEF DESCRIPTION OF THE DRAWINGS

In the accompanying drawings which are incorporated in and constitute a part of the specification, embodiments of the invention are illustrated, which, together with a general description of the invention given above, and the detailed description given below, serve to exemplify the embodiments of this invention.

FIGS. 4-11 illustrate various views of a component orientation element in one embodiment of an apparatus illustrating principles of the present invention.

DETAILED DESCRIPTION OF ILLUSTRATED EMBODIMENT

Figure 1:
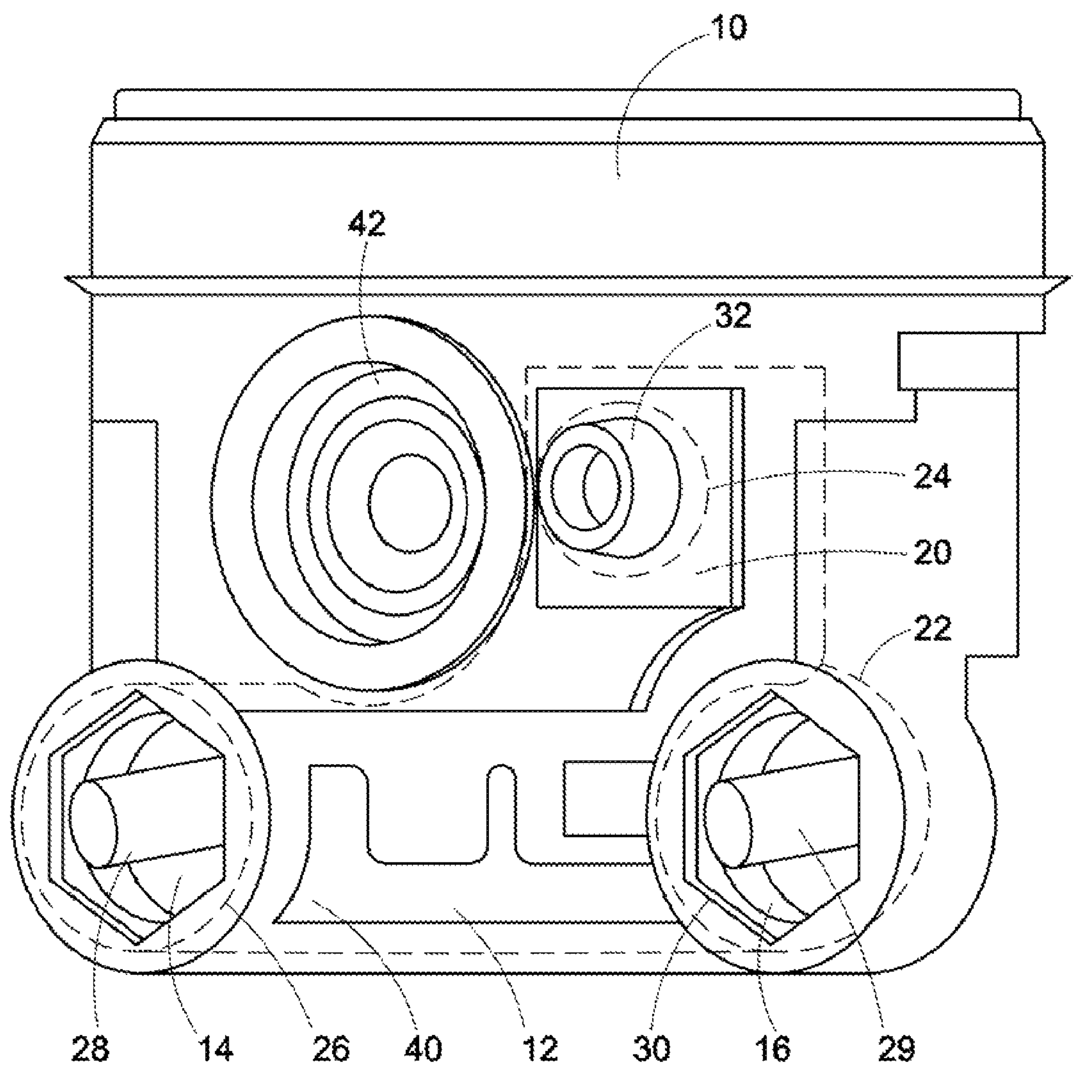
FIG. 1 illustrates a front view of a schematic representation of a component for a vehicle in accordance with one embodiment of an apparatus illustrating principles of the present invention.

With reference to FIG. 1, a component 10 is illustrated in accordance with one embodiment of the present invention. The component 10 includes a housing 12. A pair of component mounting passages 14, 16 is defined in the housing 12. A component orientation element 20 is on the housing 12.

A vehicle bracket 22 is mounted to the component 10 and to an associated vehicle (not shown). The vehicle bracket 22 includes a vehicle orientation element 24. In one embodiment, the vehicle orientation element 24 is an orifice in the vehicle bracket 22. The vehicle bracket 22 also includes a pair of bracket passages 26, 30 on the vehicle bracket 22. For purposes of illustration, only edges of the vehicle bracket 22 and edges of the vehicle orientation element 24 (orifice) are illustrated as dashed lines in FIG. 1. It is to be understood that the vehicle bracket 22 is a substantially flat, solid material (e.g., metal) that covers portions of the component orientation element 20 (except for an extended portion 32 of the component orientation element 20, which is discussed in more detail below) when the component 10 is secured to the vehicle bracket 22.

The component mounting passages 14, 16 are spaced a first distance apart from each other along a plane that is substantially parallel to one edge of the housing 12. The bracket passages 26, 30 are also spaced apart from each other the first distance along a plane. Therefore, it is possible to align the pair of component mounting passages 14, 16 with the pair of bracket passages 26, 30. More specifically, one of the component mounting passages 14, 16 aligns with one of the bracket passages 26, 30, while the other of the component mounting passages 14, 16 aligns with the other of the bracket passages 26, 30. Respective bolts 28, 29 pass through the component mounting passages 14, 16 and the bracket passages 26, 30 to secure the component 10 to the vehicle bracket 22.

Since the pair of component mounting passages 14, 16 are spaced the same distance from each other that the pair of bracket passages 26, 30 are spaced from each other, the component 10 may potentially be mounted in a plurality of orientations with respect to the vehicle bracket 22 while the pair of component mounting passages 14, 16 are aligned with the pair of bracket passages 26, 30. In one embodiment, it is required that the component 10 be oriented in only one (e.g., a correct) of the plurality of orientations (e.g., for the component 10 to operate properly).

With reference to FIGS. 1-4, 7, 8, and 11, the component orientation element 20 includes an extended portion 32 (e.g., a hub), a latching tab 34, and an insertion guide 36.

Figure 6:
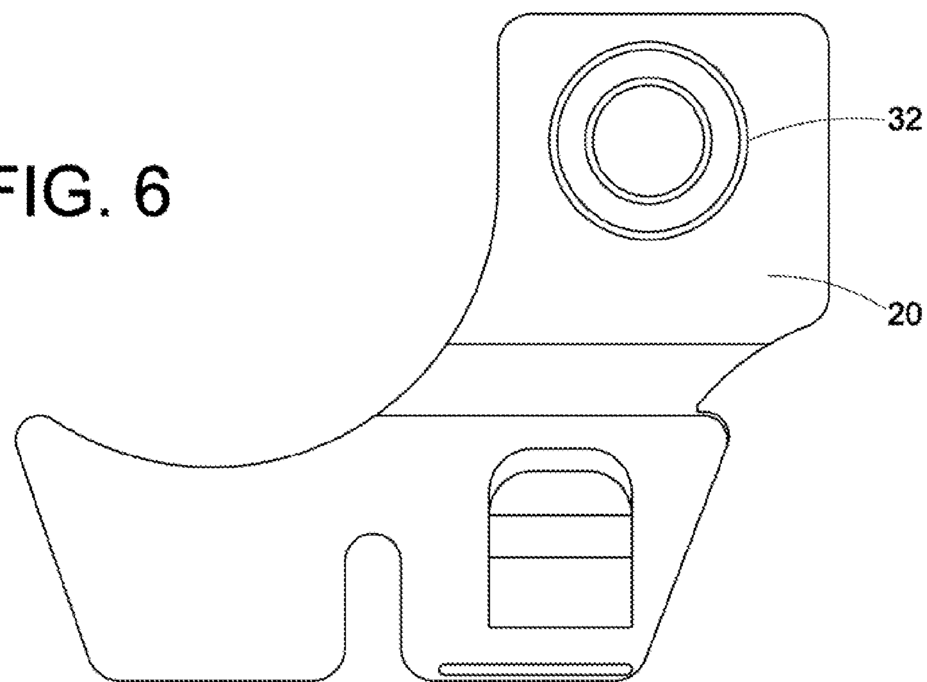
Figure 7:
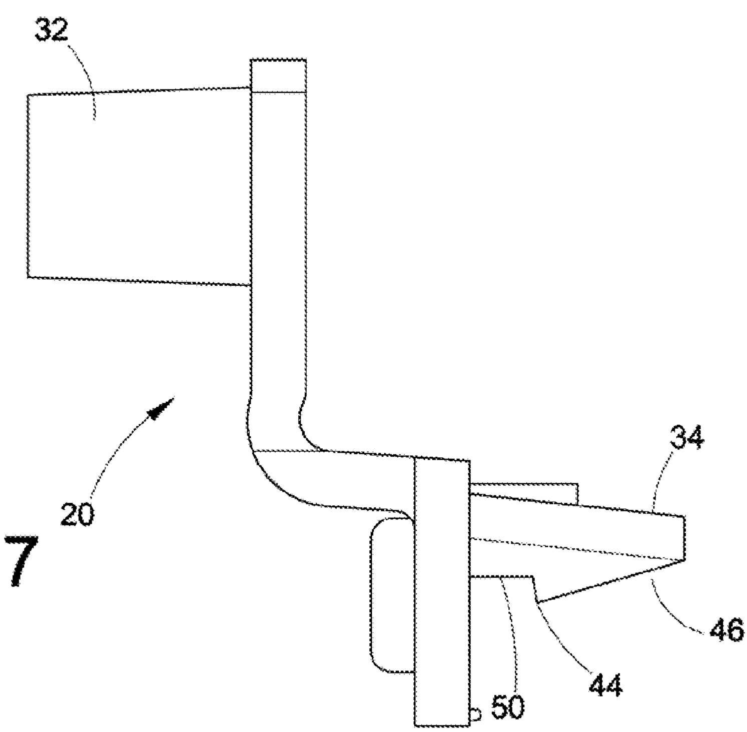
Figure 11:
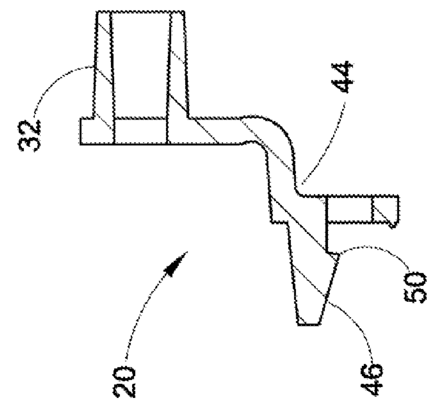
Figure 9:
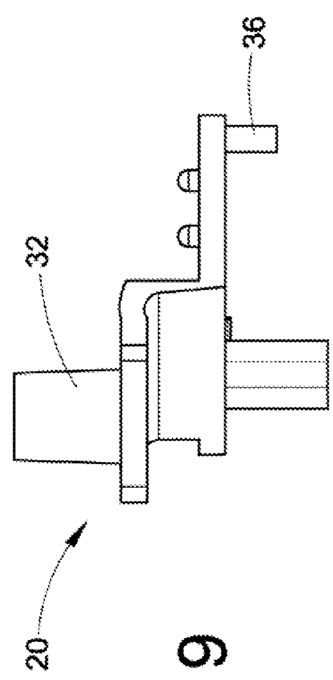
Figure 10:
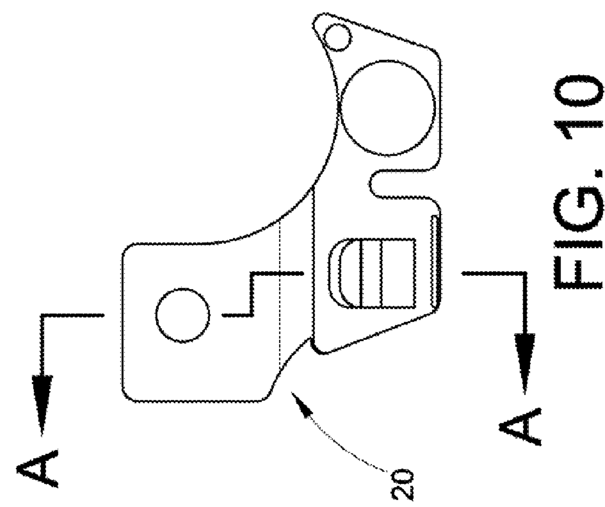
Figure 8:
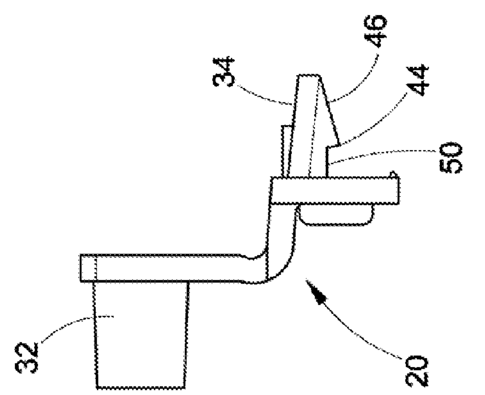

As best seen in FIGS. 1, 6, and 9, in one embodiment the hub 32 is a circular wall extending away from a surface 40 of the housing 12 that is adjacent to the vehicle bracket 22. A diameter of the hub 32 is larger at the base than at the end (e.g., the hub 32 is frusto-conically shaped). In one embodiment, the hub 32 is asymmetrically aligned with the component mounting passages 14, 16 (e.g., the hub 32 is not along a plane including the component mounting passages 14, 16). As discussed in more detail below, the hub 32 optionally includes one or more notches (slots). The hub 32 and the orifice 24 (vehicle orientation element) are sized and positioned so that the hub 32 cooperates with (e.g., is aligned with and/or received in) the orifice 24 when the component 10 is in the correct orientation. In one embodiment, the hub 32 does not contact an edge (wall) of the orifice 24, nor does the bracket 22 contact the component orientation element 20. The component mounting passages 14, 16 may be configured to extend away from the surface 40 of the housing 12 to contact the bracket 22 (or the vehicle frame) so that the surface 40 of the housing 12 is spaced from the vehicle bracket 22 (and the associated vehicle). In this regard, the component 10 is spaced from the vehicle bracket 22 (and the associated vehicle) to, for example, provide ventilation for a vent 42 on the component 10.

Figure 2:
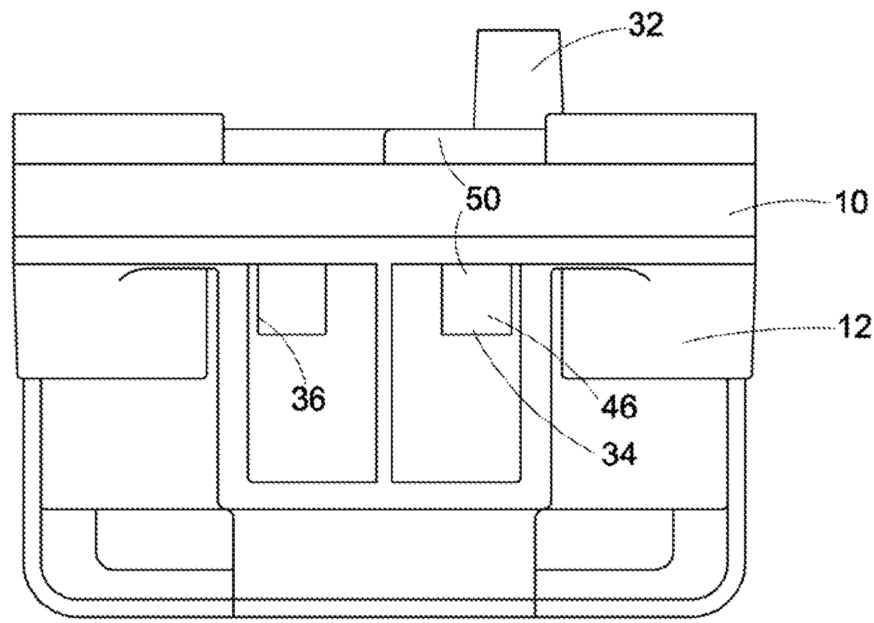
FIG. 2 illustrates a bottom view of the component of FIG. 1 in one embodiment of an apparatus illustrating principles of the present invention.
Figure 3:
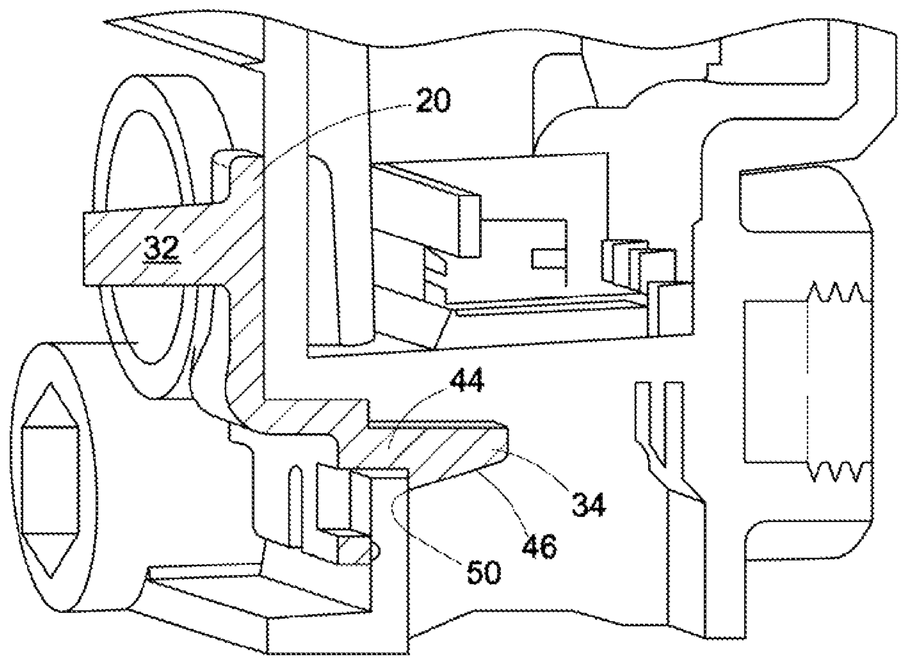
FIG. 3 illustrates a cross-sectional view of the component of FIG. 1 in one embodiment of an apparatus illustrating principles of the present invention.

As best seen in FIGS. 2-4, 7, 8, and 11, the latching tab 34 is included on an arm 44 of the component orientation element 20 that extends into the housing 12 of the component 10. As best seen in FIG. 3, the arm 44, on which the latching tab 34 is included, flexes when a ramp portion 46 of the locking tab 34 engages the housing 12 as the component orientation element 20 is inserted onto the housing 12. A wall 50 of the locking tab 34 engages the housing 12 when the component orientation element 20 is fully inserted into the housing 12. When the component orientation element 20 is fully inserted into the housing 12 in the one of the plurality of orientations (e.g., the correct orientation), the component orientation element 20 is on a surface of the housing 12 that is adjacent to the vehicle bracket while the component mounting passages 14, 16 are aligned with the bracket mounting passages 26, 30. Since the arm 44 of the component orientation element 20 flexes, the locking tab 34 and arm 44 may be moved to disengage the wall 50 of the locking tab 34 from the housing 12. In this manner, the component orientation element 20 may be removed from the housing 12 to, for example, replace the component orientation element 20 with another component orientation element (for reasons that are discussed in more detail below).

As best seen in FIGS. 2, 4, 5, and 9, the insertion guide 36 extends into the housing 12 of the component 10 as the component orientation element 20 is inserted into the housing 12. The insertion guide 36 facilitates alignment of the component orientation element 20 with the component 10 as the component orientation element 20 is inserted into the housing 12.

With reference again to FIG. 1, as noted above the hub 32 is received in the orifice 24 when the component 10 is in the correct orientation. If the component 10 is not oriented in the one of the plurality of orientations (e.g., the component 10 is not in the correct orientation), the hub 32 engages a surface (e.g., the vehicle bracket 22 or the vehicle itself), which provides increased resistance to an operator installing the component 10 (since, for example, the hub 32 is not received in the orifice 24). The increased resistance felt by the operator would provide tactile feedback to the operator, which would function to alert the operator that the component 10 is not in the correct orientation. In that case, if the operator continues to apply force in an attempt to install the component 10 in an incorrect orientation, the force will be applied to the hub 32.

It is contemplated that the hub 32 is a material that is relatively softer than a material of the housing 12. Therefore, the hub 32 deforms under relatively less force (pressure) (e.g., about 50% tensile strength) than the housing 12. The relatively softer material of the hub 32 permits the hub 32 to deform before the relatively harder material of the housing 12 when a predetermined threshold pressure is applied. Such a design reduces damage to the housing 12, while allowing the hub 32 to yield as a crumple zone. In one embodiment, the hub 32 is a 10% glass reinforced polycarbonate and polybutylene terephthalate blend with ultraviolet stabilizer, while the housing 12 is a 35% glass fill PA66 nylon material.

Although the component 10 is illustrated as being secured to the bracket 22 which, in turn, is secured to the associated vehicle, it is also contemplated in other embodiments that the component 10 is secured directly to a frame (e.g., a frame rail) of the associated vehicle without the use of a bracket. In this embodiment, bolts that are aligned with the component mounting passages pass through the component mounting passages and to (or through) the frame. As in the embodiment discussed above, vibrations from the vehicle pass to the component via the bolts.

With reference to FIGS. 1-3, in one embodiment, the hub 32 of the component orientation element 20 does not engage an edge (wall) of the orifice 24 when the component 10 is in the correct orientation. Because the arm 44 flexes, the latching tab 34 and arm 44 permit an oscillation (e.g., a spring action) of the component orientation element 20 (e.g., the hub 32) with respect to the housing 12 when the component orientation element 20 is secured to the housing 12. The oscillation (e.g., spring action) of the component orientation element 20 (e.g., the hub 32) acts to null (e.g., cancel or absorb) vibrations received by the component 10 from the associated vehicle, via the, for example, the bolts 28, 29. In this manner, the component orientation element 20 (e.g., the hub 32) acts to damp the vibrations transmitted from the associated vehicle to the housing 12 via the bolts 28, 29. In other words, vehicle vibrations received by the hub 32, via the bolts 28, 29, causes the hub 32 to flex. The flexures of the hub 32 act to null (e.g., cancel and/or absorb) and damp the vibrations transmitted from the associated vehicle to the housing 12 via the bolts 28, 29.

The amount of damping and the frequency (or frequencies) nulled (e.g., canceled and/or absorbed) by the hub 32 is based on a design (shape) and thickness of the hub 32. For example, the hub 32 discussed above (and illustrated in FIGS. 1-4, 6-9, and 11) is frusto-conically shaped with a diameter at the base that is larger than the diameter at the end. As discussed in more detail below, other designs (shapes) and thicknesses of the hub 32 having other vibration transmission responses can be used for tuning the hub 32 for damping and/or absorbing other the frequencies.

Figure 12:
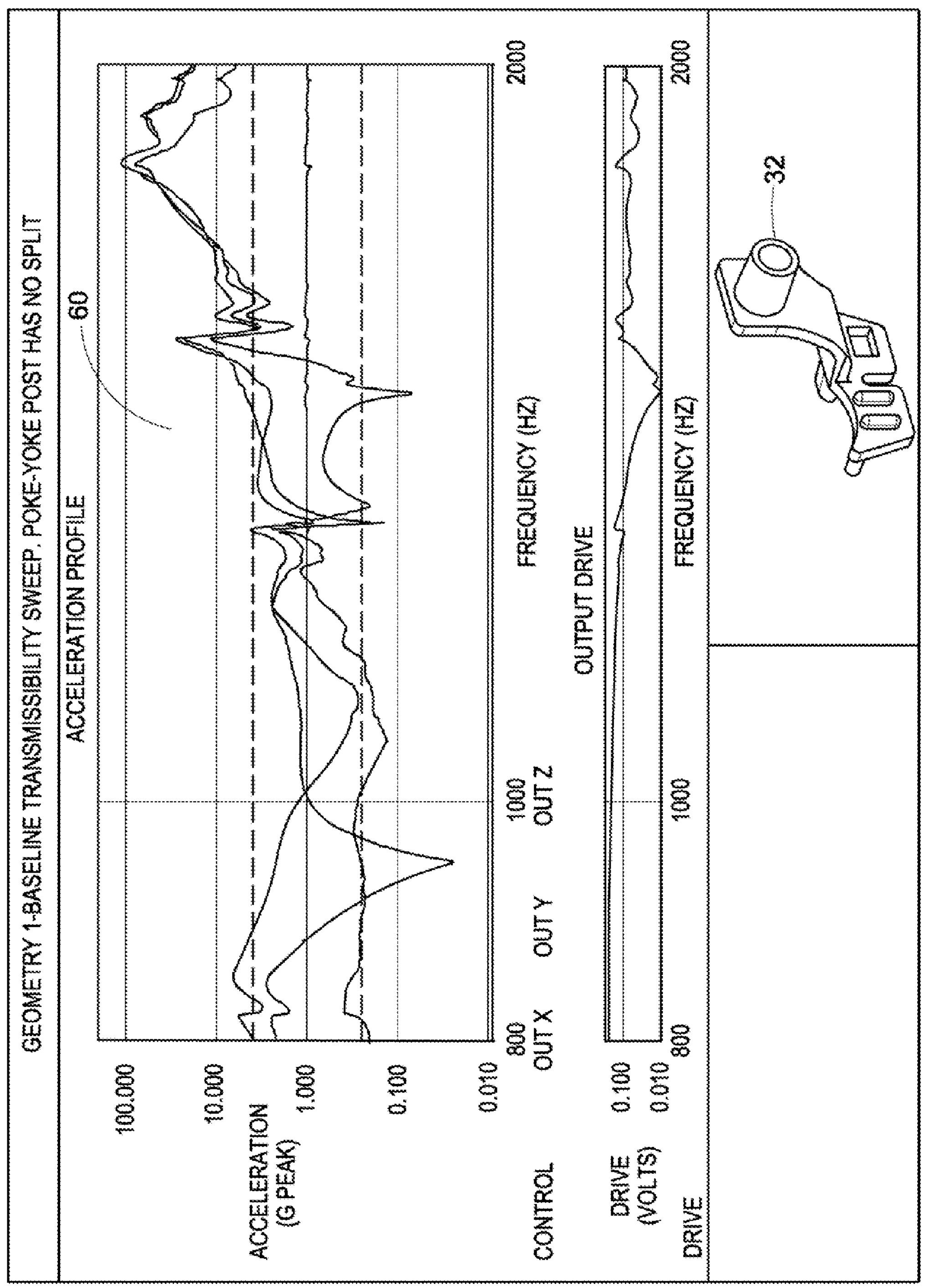
FIGS. 12-18 illustrate various acceleration profiles for respective component orientation elements in different embodiments of the present invention.

With reference to FIG. 12, an acceleration profile 60 (e.g., acceleration vs. frequency, which is also referred to as a vibration transmission response) is illustrated for the hub 32 discussed above and shown in FIGS. 1-4, 6-9, and 11. Since the acceleration profile 60 is associated with the hub 32 discussed above, the hub 32 discussed above is referred to as the baseline hub, and the profile 60 is referred to as the baseline profile.

FIGS. 13-18 illustrate acceleration profiles for hubs having different designs.

Figure 13:
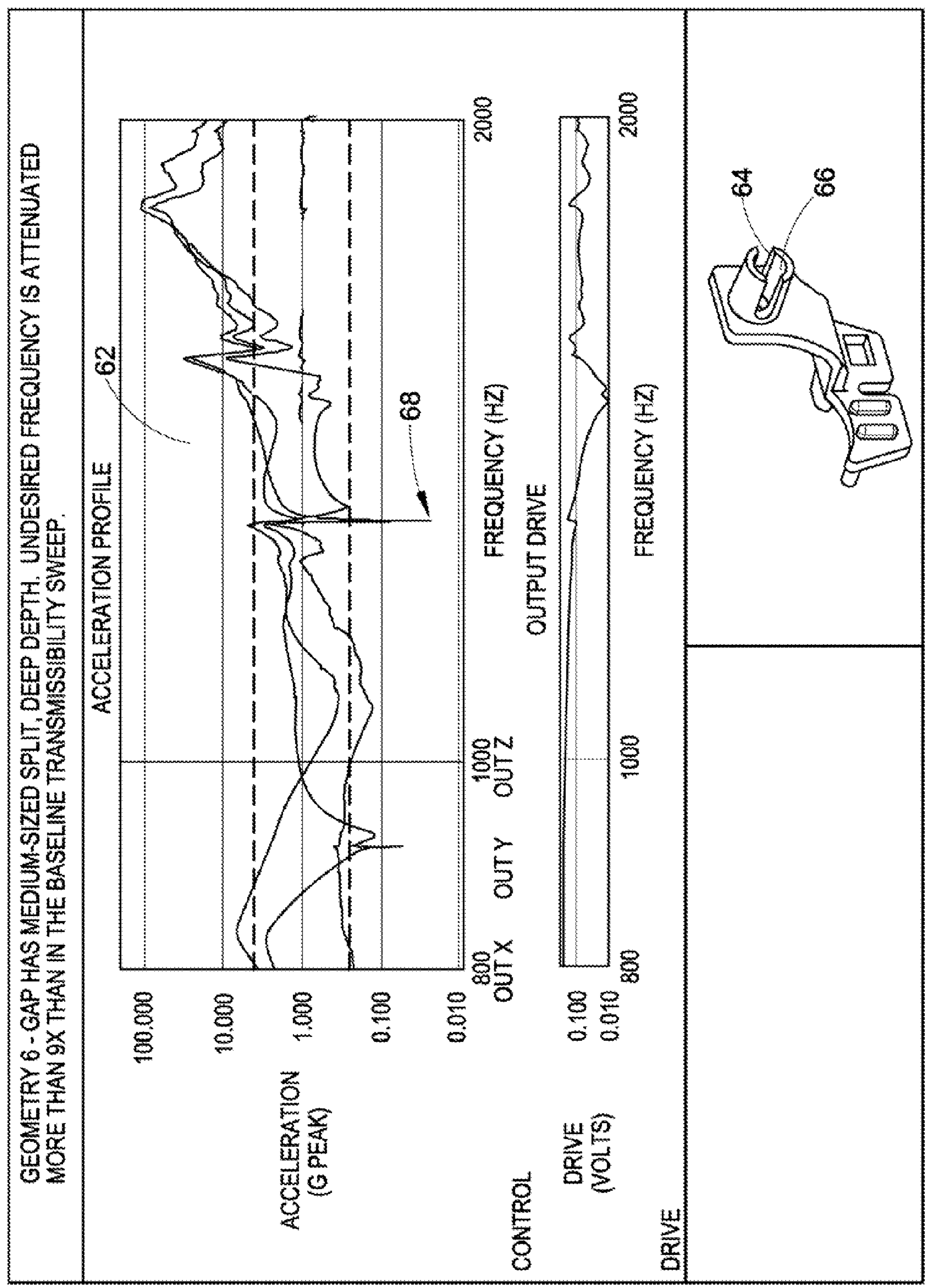

With reference to FIG. 13, an acceleration profile 62 is illustrated for a hub 64 having symmetric notches 66 approximately 180° apart. The notches 66 in this embodiment are medium-sized splits having relatively deep depths with respect to the baseline hub. The hub 64 results in the profile 62 having an undesired frequency 68 attenuated at least 9 times relative to the baseline hub.

Figure 14:
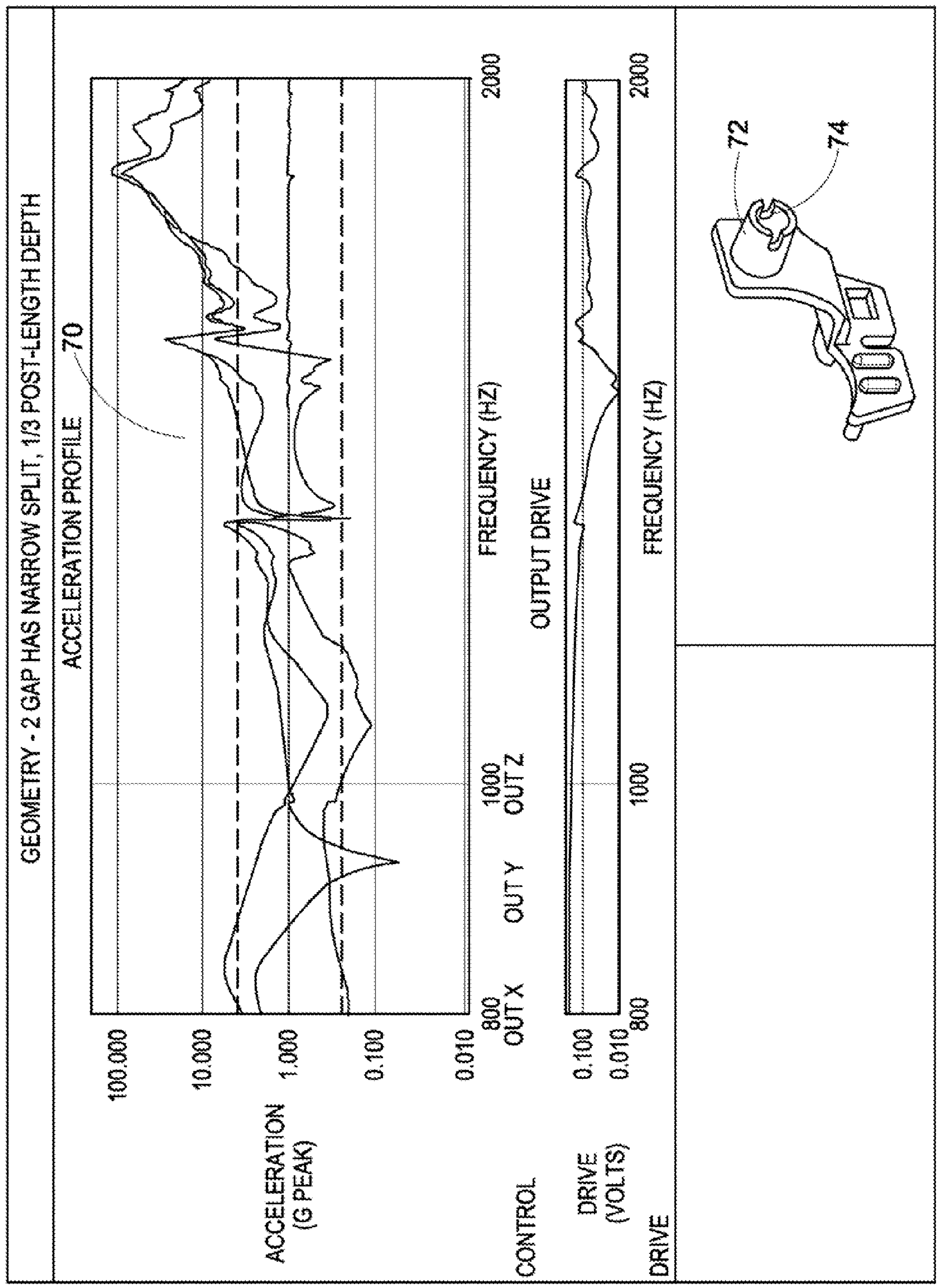

With reference to FIG. 14, an acceleration profile 70 is illustrated for a hub 72 having symmetric notches 74 approximately 180° apart. The notches 74 in this embodiment create relatively narrow splits having depths that are about ⅓ the depth of the hub 72. The hub 72 results in the profile 70, which is different from the baseline hub.

Figure 15:
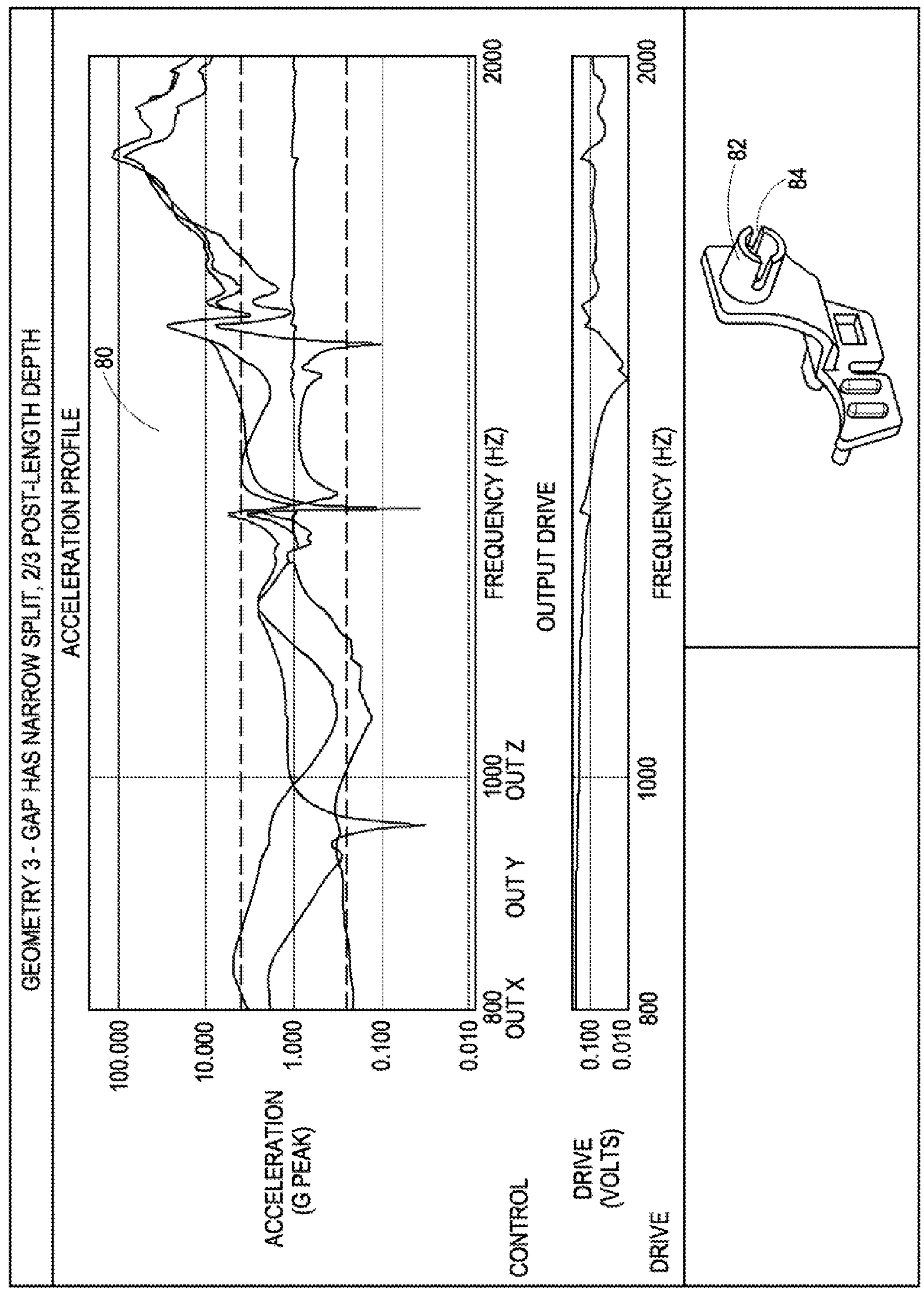

With reference to FIG. 15, an acceleration profile 80 is illustrated for a hub 82 having symmetric notches 84 approximately 180° apart. The notches 84 in this embodiment create relatively narrow splits having depths that are about ⅔ the depth of the hub 82. The hub 82 results in the profile 80, which is different from the baseline hub.

Figure 16:
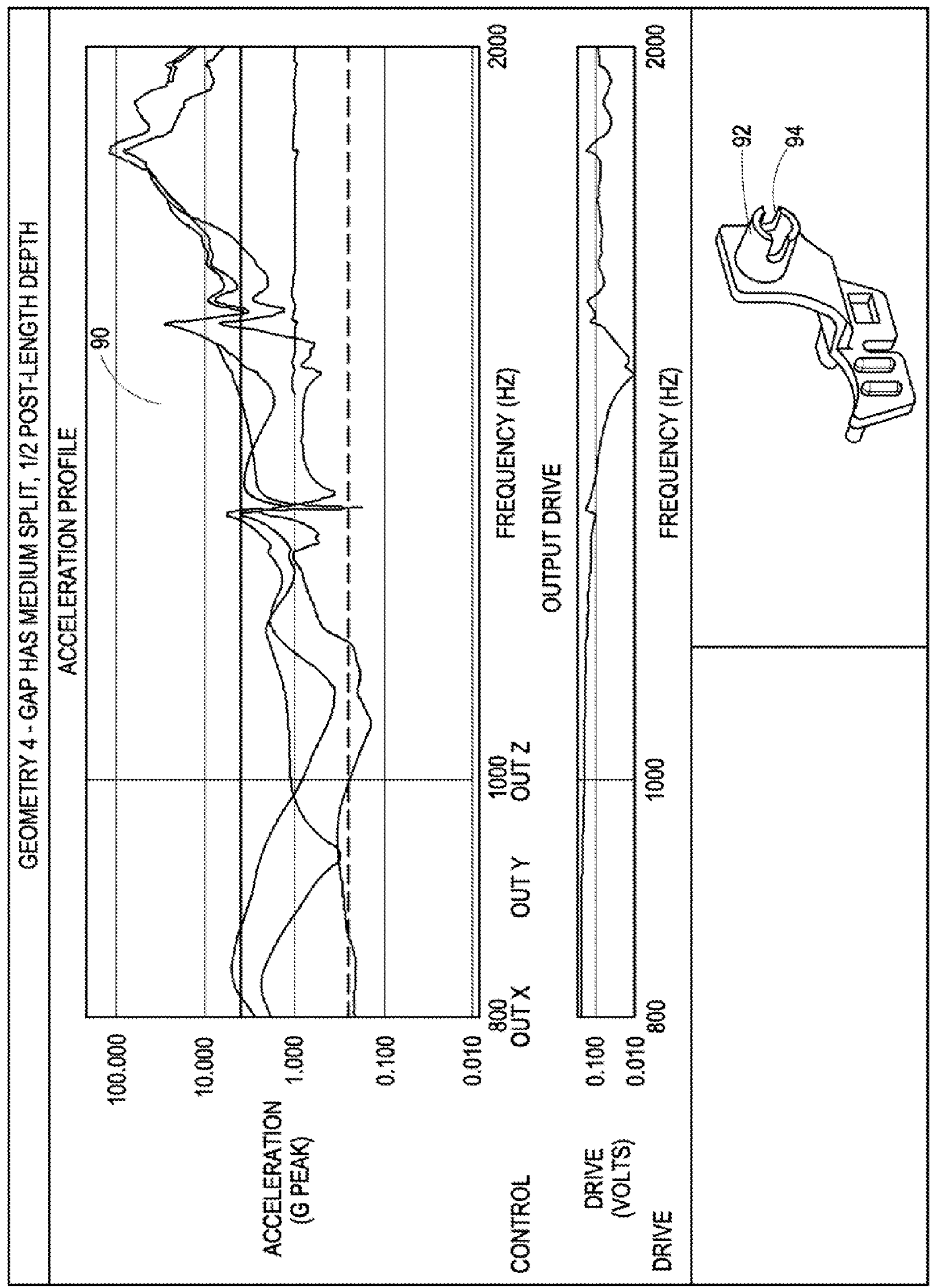

With reference to FIG. 16, an acceleration profile 90 is illustrated for a hub 92 having symmetric notches 94 approximately 180° apart. The notches 94 in this embodiment create relatively medium-sized splits having depths that are about ½ the depth of the hub 92. The hub 92 results in the profile 90, which is different from the baseline hub.

Figure 17:
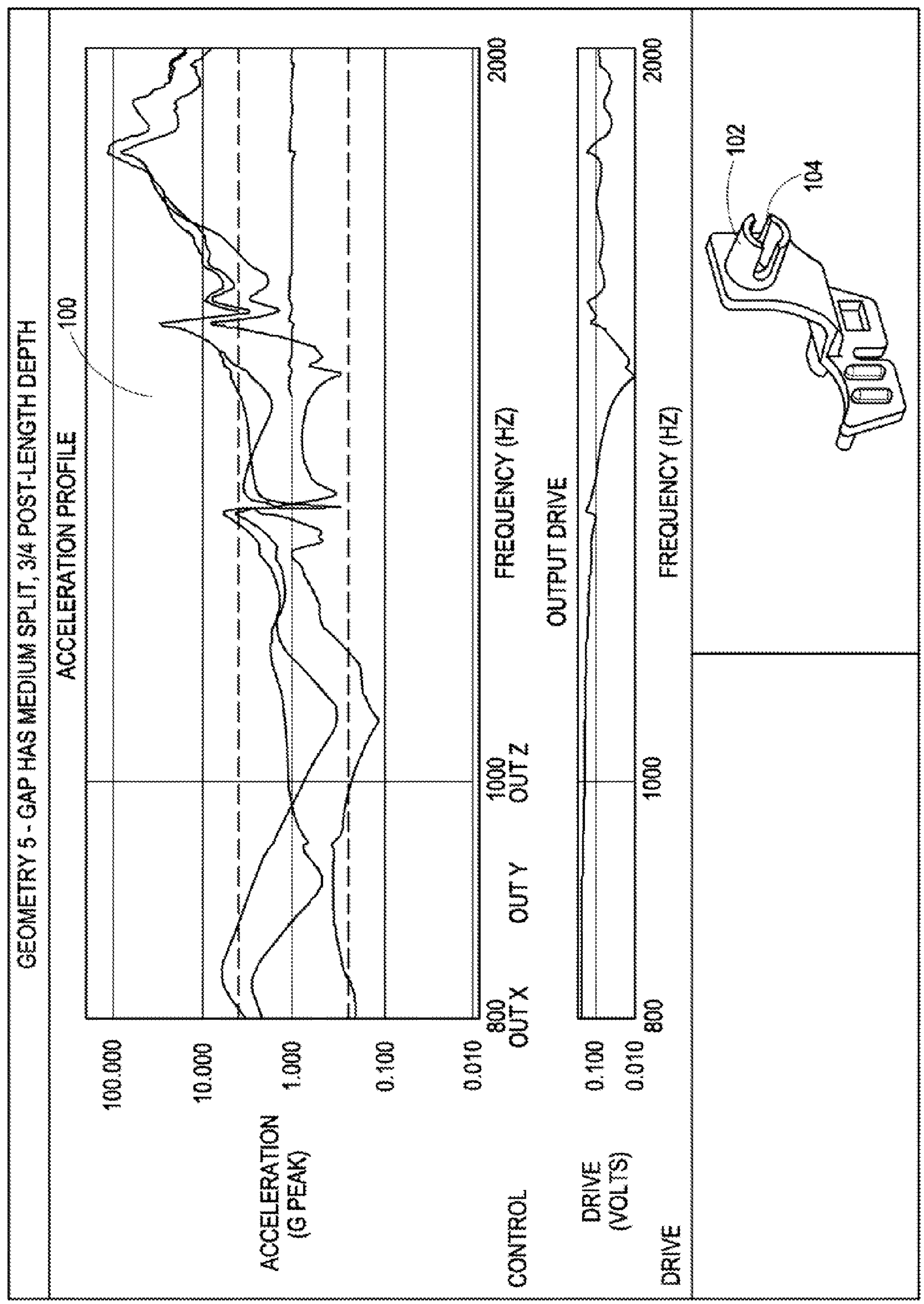

With reference to FIG. 17, an acceleration profile 100 is illustrated for a hub 102 having symmetric notches 104 approximately 180° apart. The notches 104 in this embodiment create relatively medium-sized splits having depths that are about ¾ the depth of the hub 102. The hub 102 results in the profile 100, which is different from the baseline hub.

Figure 18:
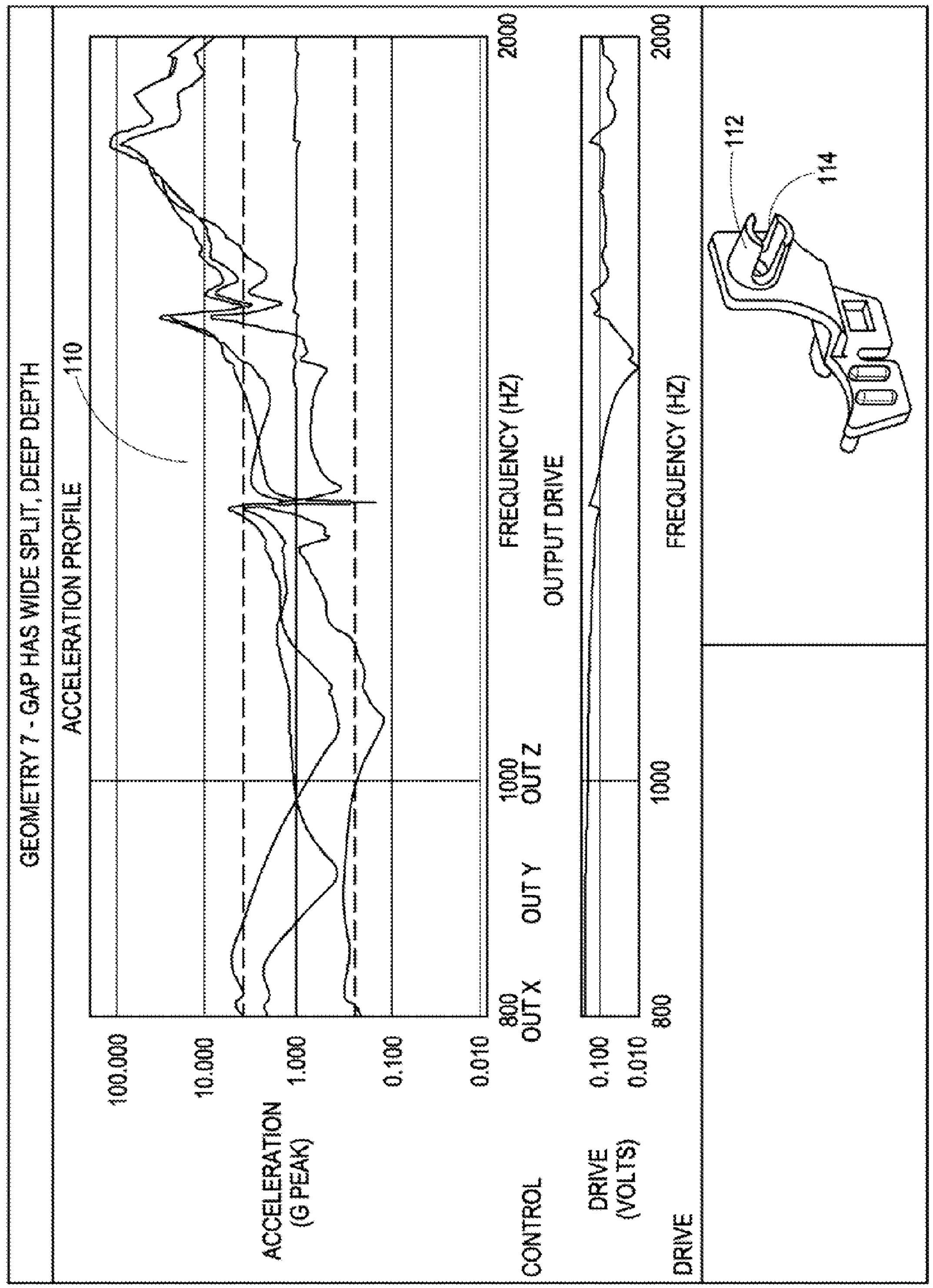

With reference to FIG. 18, an acceleration profile 110 is illustrated for a hub 112 having symmetric notches 114 approximately 180° apart. The notches 114 in this embodiment create relatively wide splits having relatively deep depths in the hub 112. The hub 112 results in the profile 110, which is different from the baseline hub.

The embodiments discussed above include at least two (2) notches for damping vibration transmitted from the associated vehicle to the housing.

It is to be understood that all of the hubs (and component orientation elements) are removably secured to the housing 12, as described above, which facilitates swapping one of the hubs (and component orientation elements) for another one of the hubs (and component orientation elements) to achieve damping of vibrations (at a desired frequency) transmitted from the vehicle to the component 10 via, for example, the bolts. In other words, any of the hubs (and component orientation elements), which may damp vibrations at a first frequency, may be swapped for any of the other hubs (and component orientation elements), which may damp vibrations at a second frequency, to achieve a desired vibration transmission response.

While the present invention has been illustrated by the description of embodiments thereof, and while the embodiments have been described in considerable detail, it is not the intention of the applicants to restrict or in any way limit the scope of the appended claims to such detail. Additional advantages and modifications will readily appear to those skilled in the art. Therefore, the invention, in its broader aspects, is not limited to the specific details, the representative apparatus, and illustrative examples shown and described. Accordingly, departures may be made from such details without departing from the spirit or scope of the applicant's general inventive concept.

We claim:

1. A component to be mounted on a vehicle, comprising:

a housing;

a pair of component mounting passages, defined in the housing, aligning with a pair of respective vehicle mounting passages when the component is any of a plurality of orientations with respect to the vehicle; and a component orientation element, on the housing, extending away from a surface of the housing adjacent to the vehicle and cooperating with a vehicle orientation element only when the component is in one of the plurality of orientations with respect to the vehicle, the vehicle orientation element being an orifice, and the component orientation element being positioned and sized to be received in the orifice when the component is in the one orientation with respect to the vehicle, receiving vibrations from an associated vehicle via at least one bolt in one of the component mounting passages and in one of the vehicle mounting passages, and damps the vibrations transmitted to the housing.

2. The component to be mounted on a vehicle as set forth in claim 1, wherein:

the component orientation element is on a surface of the housing adjacent to the vehicle when the component mounting passages are aligned with the vehicle mounting passages and the component is in the one orientation with respect to the vehicle.

3. The component to be mounted on a vehicle as set forth in claim 1, wherein:

the component orientation element is secured to the housing to permit oscillation of the component orientation element; and the oscillation of the component orientation element absorbs the vibrations from the associated vehicle to damp the vibrations transmitted to the housing.

4. The component to be mounted on a vehicle as set forth in claim 1, wherein:

the component orientation element includes a notch formed in an end that is extended away from the housing; and at least one of an amount and a frequency of the vibration damped is based on a configuration of the notch.

5. The component to be mounted on a vehicle as set forth in claim 1, wherein the component orientation element is deformed under relatively less pressure than the housing.

6. The component to be mounted on a vehicle as set forth in claim 5, wherein:

the component orientation element extends away from a surface of the housing adjacent to the vehicle when the component is in the one orientation with respect to the vehicle; and the component orientation element is deformed, while the housing is not deformed, if the pair of component mounting passages is aligned with the pair of respective vehicle mounting passages when the component is not in the one orientation with respect to the vehicle.

7. The component to be mounted on a vehicle as set forth in claim 5, wherein:

a material of the component orientation element is relatively softer than a material of the housing.

8. The component to be mounted on a vehicle as set forth in claim 1, wherein:

the component orientation element is removably secured to the housing.

9. The component to be mounted on a vehicle as set forth in claim 1 wherein;

the component is mounted to the vehicle via a bracket.

10. A component to be mounted on a vehicle of an associated vehicle, comprising:

a housing;

a pair of component mounting passages, defined in the housing, aligning with pair of respective vehicle mounting passages when the component is in any of a plurality of orientations with respect to the vehicle; and a component orientation element, secured to the housing, aligned with a vehicle orientation element only when the component is in one of the plurality of orientations with respect to the vehicle, the component orientation element including at least one slot for tuning the component orientation element to damp vibration transmitted from the associated vehicle to the housing.

11. The component to be mounted on a vehicle of an associated vehicle as set forth in claim 10, wherein:

the at least one slot in the component orientation element is configured for a first vibration transmission response; and the component orientation element is removably secured to the housing for facilitating swapping the component orientation element with a second component orientation element having a second vibration transmission response.

12. The component to be mounted on a vehicle of an associated vehicle as set forth in claim 10:

wherein the component orientation element includes a circular wall extending away from the housing:, and further including:

a second of the at least one slots on the component orientation element, the slots being formed approximately 180° apart along the circular wall.

13. The component to be mounted on a vehicle of an associated vehicle as set forth in claim 12 wherein:

a first of the at least one slot acts in conjunction with the second slot to damp the vibration transmitted from the associated vehicle to the housing.

14. The component to be mounted on a vehicle of an associated vehicle as set forth in claim 10, wherein:

the component orientation element is positioned asymmetrically on the housing with respect to the pair of component mounting passages.

15. The component to be mounted on a vehicle of an associated vehicle as set forth in claim 10, wherein:

the component orientation element extends away from housing and is a relatively softer material than the housing; and the component orientation element deforms before the housing deforms, if the housing is installed in one of the other of the plurality of orientations that causes the component orientation element to abut the associated vehicle with a predetermined amount of force.

16. The component to be mounted on a vehicle of an associated vehicle as set forth in claim 10, wherein:

respective bolts in the pair of component mounting passages, which are aligned with the respective vehicle mounting passages, transmit the vibration from the associated vehicle to the housing;

the vehicle orientation element is an orifice;

the component orientation element is removably secured to the housing to permit an oscillation of the component orientation element; and the oscillation of the component orientation element attenuates the vibration transmitted to the housing from the vehicle.

17. A method of mounting a component to a vehicle of an associated vehicle, the method comprising:

aligning a pair of component mounting passages, defined in a housing of the component, with a pair of respective vehicle mounting passages;

determining if the component is oriented in one of a plurality of orientations with respect to the vehicle, the one orientation being a correct orientation, the determining step including;

applying pressure to component orientation element on the housing, the applying step including;

if the pressure applied to the component orientation element is above a predetermined threshold, a material of the component orientation element permitting the component orientation element to deform before the housing; and if the component is oriented in the one orientation, the orientation element, on the housing, aligning with a vehicle orientation element.

18. The method of mounting a component to a vehicle of an associated vehicle as set forth in claim 17, further including:

replacing the component orientation element with a second component orientation element including a notch for tuning the component orientation element to attenuate vibrations transmitted from the vehicle to the housing.

* * * * *